United States Patent
Mycynek

[11] Patent Number: 5,575,003
[45] Date of Patent: Nov. 12, 1996

[54] CURRENT MODE AGC SYSTEM FOR TELEVISION TUNER

[75] Inventor: Victor G. Mycynek, Des Plaines, Ill.

[73] Assignee: Zenith Electronics Corporation, Glenview, Ill.

[21] Appl. No.: 354,406

[22] Filed: Dec. 12, 1994

[51] Int. Cl.⁶ ......................................................... H04B 1/06
[52] U.S. Cl. ...................................... 455/234.1; 455/241.1
[58] Field of Search ............................. 455/234.1, 239.1, 455/241.1, 242.2, 242.1, 243.1, 250.1, 251.1, 253.2; 348/725, 726, 733, 678

[56] References Cited

U.S. PATENT DOCUMENTS

| | | | |
|---|---|---|---|
| 4,186,351 | 1/1980 | Brefini et al. | 455/234.1 |
| 4,209,805 | 6/1980 | Ikeda et al. | 455/251.1 |
| 4,329,713 | 5/1982 | Harford | 348/678 |
| 4,912,775 | 3/1990 | Matsuura | 455/234.1 |

Primary Examiner—Reinhard J. Eisenzopf
Assistant Examiner—Marsha D. Banks-Harold

[57] ABSTRACT

The tuner-IF system operates with three current mirrors. One current mirror accepts an AGC signal and develops an RF AGC voltage, another current mirror accepts the AGC signal and develops an IF AGC voltage and a third current mirror establishes a minimum IF gain for the system and allows for additional slight IF gain reduction for excessive incoming signals. The three current mirrors are of the Wilson type and enable flexibility in establishing crossover points, delay times between the tuner RF and IF gain reductions and the like.

4 Claims, 1 Drawing Sheet

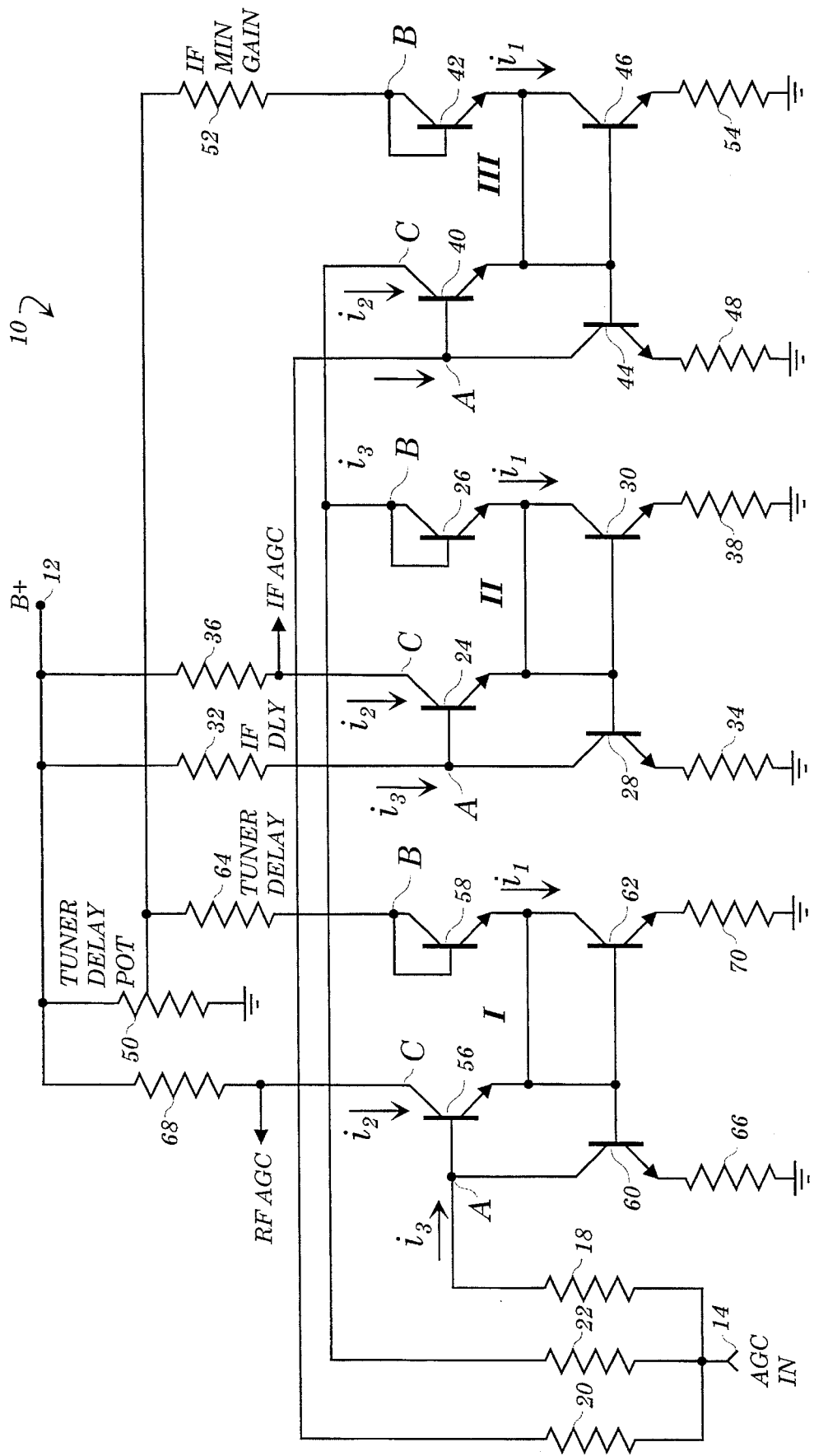

5,575,003

CURRENT MODE AGC SYSTEM FOR TELEVISION TUNER

BACKGROUND OF THE INVENTION AND PRIOR ART

This invention relates in general to tuner IF systems and in particular to a novel tuner IF system that operates in a current mode as distinct from a voltage mode. The advantages in using current mirrors in this configuration are that reverse bias base emitter junctions are kept below one diode drop (0.7 V) and the operation of the AGC system occurs within two diode drops (1.4 V) of ground. This precludes reverse biased base-emitter junction breakdown and provides for low voltage operation. Thus, the crossover and gain relationships between tuner and IF gain controls are set by currents. The tuner-IF controller of the invention utilizes a first current mirror for developing an RF AGC potential from an AGC signal input, a second current mirror for developing an IF AGC signal input and a third current mirror for establishing the minimum IF gain and for providing a "slope", i.e. a moderate amount of IF gain reduction beyond the minimum, with increasing signal levels. With the invention, the break point (crossover point) and the overlap between the RF AGC and the IF AGC may be readily changed as well as the amount of AGC gain reduction provided by the RF and IF stages.

OBJECTS OF THE INVENTION

A principal object of the invention is to provide a novel current mode AGC system for a tuner IF arrangement.

Another object of the invention is to provide a tuner IF AGC system that utilizes current mode control with tuner delay tracking.

A further object of the invention is to provide an AGC system that operates in low voltage applications with very low reverse biased base-emitter junctions.

BRIEF DESCRIPTION OF THE DRAWING

These and other objects and advantages of the invention will be apparent upon reading the following description in conjunction with the drawing, the single of which is a simplified schematic diagram with a tuner-IF control system constructed in accordance with the invention.

DESCRIPTION OF THE PREFERRED EMBODIMENT

Referring to the single figure of the drawing, a tuner IF control system generally indicated by reference numeral 10, includes three current mirrors of the Wilson type. They are labelled I, II and III with I being the RF AGC circuit, II being for the IF AGC circuit, and III establishing the minimum gain of the IF AGC and establishing the crossover between the tuner and IF gain reduction.

A source of AGC signal input is applied to a terminal 14 and is coupled by a number of resistors 18, 22 and 20, respectively, to current mirror I, current mirror II and current mirror III. The current mirror I includes NPN transistors 56, 60 and 62, with a transistor 58 serving as a voltage balancing transistor, since it is connected as a diode in the configuration. The current mirror has three current nodes identified as A, B and C with node A being the base of transistor 56 and node C its collector and node B being the base collector junction of transistor 58. As illustrated, currents $i_1$, $i_2$ and $i_3$ flow into the nodes B, C and A respectively. The emitters of transistors 60 and 62 are connected to ground through resistors 66 and 70, respectively, their bases are connected together and their collectors are connected to node A and to node B, through the diode-connected transistor 58, respectively. The ground resistors 66 and 70 are used for current balancing of the current mirror. The RF AGC potential is taken from a resistor 68 coupled between B+ and node C. In the Wilson current mirror, the relationship between the currents is driven by the equation $i_2$ is equal to $i_3$ minus $i_1$ when $i_3$ is greater than $i_1$ otherwise, $i_2$ is equal to zero. Tuner delay determines at what AGC input the IF gain reduction terminates (or is greatly diminished) and the tuner gain commences reduction. A tuner delay potentiometer 50 is coupled between a source of B+ and a tuner delay resistor 64 that in turn supplies node B of current mirror I. The AGC signal input at terminal 14 is applied through resistor 18 to node A of current mirror I.

The current mirror II consists of transistors 24, 28 and 30 with transistor 26 being connected as a diode for voltage balancing purposes. Again nodes A, B and C are indicated on the current mirror II circuit arrangement and transistors 28 and 30 have their emitters connected to ground through current balancing resistors 34 and 38, respectively. The IF AGC potential is taken from resistor 36, that is connected between B+ and node C of current mirror II, with a resistor 32 between B+ and node A establishing the IF delay or the point at which the IF gain reduction begins. The AGC input at terminal 14 is applied through resistor 22 to node B of current mirror II.

Current mirror III consists of transistors 40, 44 and 46 with transistor 42 being connected as a diode for voltage balance purposes. Nodes A, B and C are illustrated on the current mirror and transistors 44 and 46 have their emitters connected to ground through current balancing resistors 48 and 54, respectively. The AGC input signal at terminal 14 is applied through resistor 22 to the collector (node C) of transistor 40 in current mirror III. It should be recalled that this potential is also supplied to node B of current mirror II for purposes to be explained. The AGC input signal is also applied through resistor 20 to node A of current mirror III. Node B of current mirror III is coupled through an IF minimum gain resistor 52 to the tuner delay potentiometer 50.

In operation, as the RF signal becomes larger the initial gain reduction for the tuner IF combination is supplied by the IF AGC. Consequently, the IF AGC initially reduces the gain of the IF amplifier (not shown) for increasing RF signal inputs. As the RF input signal increases further, tuner or RF AGC crossover occurs and the AGC begins to gain reduce the tuner circuits. The reason for gain reducing the IF amplifier first is for better noise performance under weak RF signal conditions. The crossover point is determined by resistors 32, resistor 52, the delay potentiometer 50 and resistor 64. It should be noted that nodes B of current mirrors I and III receive proportional currents from tuner delay potentiometer 50 for tracking purposes. Changing these resistors will result in changing of the crossover point as well as the amount and rate of gain reduction of the IF and RF AGC.

The current mirror III operates in partial opposition to current mirror II to enable a small amount of further gain reduction by the IF AGC even though the IF has passed the minimum IF gain threshold and the RF AGC is in the process of reducing the tuner gain. This is accomplished by varying the value of resistor 20 which supplies the $i_3$ current to node A of current mirror III. Since current mirror III and current mirror II are connected in opposition, the current flowing in current mirror III subtracts from the current flowing in current mirror II. The IF minimum gain determined by the maximum IF AGC potential developed is controlled by the current flow into node B of current mirror III, which current mirror action results in node C of current mirror III siphoning or diverting current from node B of current mirror II. This sets the minimum gain characteristic or the minimum gain point for the IF AGC by establishing the maximum gain reduction.

If all of the resistors 18, 20 and 22 are equal in value, the IF AGC voltage curve will flatten. At some point no further gain reduction will occur in the IF. However, as mentioned, by changing the value of resistor 20, the balance is upset and a slight slope in the IF gain reduction curve will occur such that small reductions in the IF gain will continue to be made with further increases in input signal level even though the minimum gain threshold has been reached. The inherent flexibility of the circuit arrangement should be obvious to those skilled in the art. With the circuit, a wide variety of crossover points, ratios of tuner-IF gain reductions and gain reduction slopes are available to the designer. This is in the context of a current mode system that avoids problems due to large power supply voltages and large reverse biased base-emitter junctions.

What has been described is a current mode AGC circuit for a tuner-IF combination. It is recognized that numerous changes in the described embodiment of the invention will be apparent to those skilled in the art without departing from its true spirit and scope. The invention is to be limited only as defined in the claims.

What is claimed is:

1. For use with a television tuner having an RF amplifier and an IF amplifier and an AGC signal;

a first current mirror supplied with said AGC signal for developing an RF AGC potential for said RF amplifier;

a second current mirror supplied with said AGC signal for developing an IF AGC potential for said IF amplifier;

means for controlling the respective gain reduction of said RF AGC potential and said IF AGC potential with signal level changes;

each of said first and said second current mirrors each having first, second and third nodes;

said AGC signal being supplied to said first node of said first current mirror, said RF AGC potential being taken from said second node of said first current mirror; and a tuner delay means established by coupling a current to said third node of said first current mirror.

2. The combination of claim 1 wherein the AGC signal is supplied to said third node of said second current mirror, the IF AGC potential being taken from said second node of said second current mirror and the current in said first node of said second current mirror establishing an operational delay point for said IF AGC potential.

3. The combination of claim 2 further including a third current mirror having first, second and third nodes and wherein said first node is supplied with a current for determining the continuing gain reduction beyond said IF AGC potential and said third node is supplied with the current for determining a minimum IF gain system.

4. The combination of claim 3 wherein said third current mirror is arranged to offset a substantially current effect of said second current mirror, said third node of said second current mirror being connected in opposition to said first node of said third current mirror.

* * * * *